(12) United States Patent
Choi et al.

(10) Patent No.: US 9,754,542 B2
(45) Date of Patent: Sep. 5, 2017

(54) ELECTROWETTING DISPLAY DEVICE

(71) Applicant: Amazon Technologies, Inc., Seattle, WA (US)

(72) Inventors: SangGun Choi, Suwon-si (KR); TaeGyun Kim, Seoul (KR); Hyoungsub Lee, Seoul (KR); Woo Yong Sung, Seoul (KR); TaeWoon Cha, Seoul (KR)

(73) Assignee: Amazon Technologies, Inc., Seattle, WA (US)

( * ) Notice: Subject to any disclaimer, the term of this patent is extended or adjusted under 35 U.S.C. 154(b) by 262 days.

(21) Appl. No.: 13/765,447

(22) Filed: Feb. 12, 2013

(65) Prior Publication Data

US 2013/0300775 A1 Nov. 14, 2013

(30) Foreign Application Priority Data

May 10, 2012 (KR) .......................... 10-2012-0049790

(51) Int. Cl.
| | |
|---|---|
| *G09G 3/34* | (2006.01) |
| *G02B 26/00* | (2006.01) |
| *G11C 19/18* | (2006.01) |
| *G11C 19/28* | (2006.01) |

(52) U.S. Cl.
CPC ........... *G09G 3/348* (2013.01); *G02B 26/005* (2013.01); *G11C 19/184* (2013.01); *G11C 19/28* (2013.01); *G09G 2300/0426* (2013.01); *G09G 2300/08* (2013.01); *G09G 2310/0267* (2013.01); *G09G 2310/0286* (2013.01)

(58) Field of Classification Search
CPC ....... G02F 1/167; G02F 1/172; G02B 26/026; G09G 3/348
See application file for complete search history.

(56) References Cited

U.S. PATENT DOCUMENTS

| | | | |
|---|---|---|---|
| 7,794,799 B1* | 9/2010 | Kim et al. | 427/532 |
| 7,821,699 B1* | 10/2010 | Lo et al. | 359/290 |
| 7,944,617 B2* | 5/2011 | Ishioka | G02B 26/004 359/665 |
| 9,001,027 B2* | 4/2015 | Choi | G09G 3/348 345/107 |
| 2003/0089991 A1* | 5/2003 | Yamazaki | H01L 29/66757 257/759 |
| 2007/0188676 A1* | 8/2007 | Choi et al. | 349/62 |
| 2008/0186363 A1* | 8/2008 | Sugahara | 347/55 |
| 2009/0002590 A1* | 1/2009 | Kimura | 349/43 |
| 2009/0027317 A1 | 1/2009 | Cheng et al. | |
| 2009/0027751 A1 | 1/2009 | Chen et al. | |
| 2009/0027760 A1 | 1/2009 | Wang et al. | |

(Continued)

*Primary Examiner* — Kent Chang
*Assistant Examiner* — William Lu
(74) *Attorney, Agent, or Firm* — Lee & Hayes, PLLC

(57) ABSTRACT

An electrowetting display device including a display panel that includes a display area in which a plurality of pixels is partitioned by a partition wall and a non-display area, a data driver that applies data voltages to the pixels through a plurality of data lines, and a gate driver disposed in the non-display area to apply gate signals to the pixels through a plurality of gate lines. The pixels receive the data voltages in response to the gate signals and display gray scales corresponding to the data voltages, and the partition wall is extended in the non-display area to cover the gate driver.

21 Claims, 8 Drawing Sheets

(56) References Cited

U.S. PATENT DOCUMENTS

| | | |
|---|---|---|
| 2009/0051633 A1 | 2/2009 | Yan et al. |
| 2009/0058840 A1* | 3/2009 | Lee et al. .................. 345/204 |
| 2009/0079689 A1* | 3/2009 | Miyata et al. ............. 345/107 |
| 2009/0080052 A1 | 3/2009 | Chen et al. |
| 2009/0085909 A1* | 4/2009 | Chen et al. ................ 345/214 |
| 2010/0027100 A1* | 2/2010 | Lee et al. .................. 359/290 |
| 2010/0053717 A1* | 3/2010 | Takahashi .................. 359/228 |
| 2010/0128341 A1* | 5/2010 | Cheng .................. G02B 26/005 |
| | | 359/292 |
| 2010/0142133 A1 | 6/2010 | Wang et al. |
| 2010/0149465 A1* | 6/2010 | Lin et al. ................... 349/106 |
| 2010/0195190 A1* | 8/2010 | Ishioka ............... G02B 26/004 |
| | | 359/316 |
| 2010/0225611 A1* | 9/2010 | Lee .................... G06F 3/0412 |
| | | 345/174 |
| 2010/0245297 A1* | 9/2010 | Lee .................... G02F 1/13452 |
| | | 345/204 |
| 2010/0265445 A1 | 10/2010 | Wang et al. |
| 2011/0109607 A1 | 5/2011 | Wu et al. |
| 2011/0181934 A1* | 7/2011 | Rawert ............... G02B 26/004 |
| | | 359/228 |
| 2011/0181940 A1* | 7/2011 | Bartels ................ G02B 26/005 |
| | | 359/290 |
| 2012/0105952 A1* | 5/2012 | Takai et al. ................ 359/462 |
| 2012/0229882 A1* | 9/2012 | Fish, Jr. ................. B60R 1/025 |
| | | 359/267 |
| 2012/0306819 A1* | 12/2012 | Yamazaki et al. ............ 345/175 |
| 2013/0038922 A1* | 2/2013 | Kirita ................... G02B 26/005 |
| | | 359/316 |
| 2013/0222880 A1* | 8/2013 | Nakasuga ............ G02B 26/005 |
| | | 359/290 |
| 2013/0301106 A1* | 11/2013 | Jon ...................... G02B 26/005 |
| | | 359/290 |

* cited by examiner

ELECTROWETTING DISPLAY DEVICE

CROSS-REFERENCE TO RELATED APPLICATION

This application claims priority from and the benefit of Korean Patent Application No. 10-2012-0049790, filed on May 10, 2012, which is hereby incorporated by reference for all purposes as if fully set forth herein.

BACKGROUND

Field

Exemplary embodiments of the present invention relate to an electrowetting display device. More particularly, exemplary embodiments of the present invention relate to an electrowetting display device that may have reduced levels of parasitic capacitance in a gate driver, thereby preventing a display malfunction and preventing the gate driver from being corroded.

Discussion of the Background

In recent times, various display devices, such as a liquid crystal display, an organic light emitting diode, an electrowetting display device, a plasma display panel, electrophoretic display device, etc., have been developed.

Among them, the electrowetting display device has been spotlighted as a next generation display device because the electrowetting display device has various advantages, e.g., low power consumption, fast response speed, high visibility, etc., over the liquid crystal display.

In general, the electrowetting display device includes a display panel including a plurality of pixels, a gate driver sequentially applying gate signals to the pixels in row units, and a data driver applying data voltages to the pixels. Each pixel receives a corresponding data voltage of the data voltages in response to a corresponding gate signal of the gate signals and displays a gray scale corresponding to the received data voltage.

SUMMARY

Exemplary embodiments of the present invention provide an electrowetting display device that may have reduced levels of parasitic capacitance in a gate driver, thereby preventing a display malfunction and preventing the gate driver from being corroded.

Additional features of the invention will be set forth in the description which follows, and in part will be apparent from the description, or may be learned by practice of the invention.

An exemplary embodiment of the present invention discloses an electrowetting display device including a display panel that includes a display area in which a plurality of pixels is partitioned by a partition wall and a non-display area, a data driver that applies data voltages to the pixels through a plurality of data lines, and a gate driver disposed in the non-display area to apply gate signals to the pixels through a plurality of gate lines. The pixels receive the data voltages in response to the gate signals and display gray scales corresponding to the data voltages, and the partition wall is extended in the non-display area to cover the gate driver.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
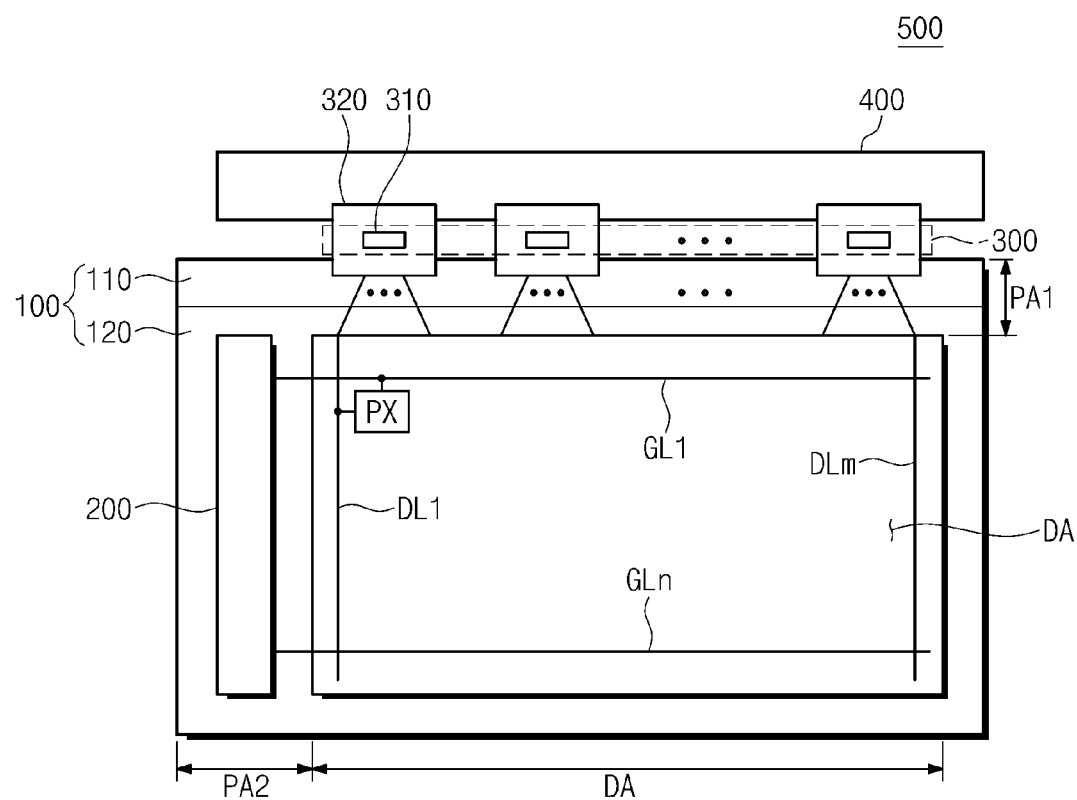
FIG. 1 is a plan view showing an electrowetting display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a plan view showing an electrowetting display device according to an exemplary embodiment of the present invention.

Referring to FIG. 1, an electrowetting display device 500 includes a display panel 100, a gate driver 200, a data driver 300, and a driving circuit substrate 400.

The display panel 100 includes a first substrate 110, a second substrate 120 facing the first substrate 110, and an electrowetting layer (not shown) disposed between the first substrate 110 and the second substrate 120. In addition, the display panel 100 includes a display area DA in which a plurality of pixels PX is arranged and first and second non-display areas PA1 and PA2 surrounding the display area DA.

The first substrate 110 includes a plurality of gate lines GL1 to GLn and a plurality of data lines DL1 to DLm crossing the gate lines GL1 to GLn. The gate lines GL1 to GLn are connected to the gate driver 200 to sequentially receive the gate signals. The data lines DL1 to DLm are connected to the data driver 300 to receive data voltages in analog form.

The pixels PX are arranged in areas defined by the gate lines GL1 to GLn and the data lines DL1 to DLm. Accordingly, the pixels PX are arranged in n rows by m columns, where "m" and "n" are integers greater than zero (0).

Each pixel PX is connected to a corresponding gate line of the gate lines GL1 to GLn, and a corresponding data line of the data lines DL1 to DLm. Each pixel PX receives a corresponding data voltage provided through the corresponding data line in response to a corresponding gate signal provided through the corresponding gate line. As a result, each pixel PX displays a gray scale corresponding to the data voltage.

The gate driver 200 may be mounted in the second non-display area PA2 in an amorphous silicon thin film transistor gate driver circuit (ASG). The gate driver 200 includes a shift register in which plural stages are connected to each other one after another. The gate driver 200 sequentially applies the gate signals to the pixels PX through the gate lines GL1 to GLn in row units. As a result, the pixels PX are driven in row units.

The data driver 300 receives data signals from a timing controller (not shown) mounted on the driving circuit substrate 400 and generates the analog data voltages corresponding to the data signals. The data driver 300 applies the data voltages to the pixels PX through the data lines DL1 to DLm. The data driver 300 includes a plurality of source driving chips 310. Each of the source driving chips 310 is mounted on a flexible circuit board 320 and connected to the driving circuit substrate 400 and the first non-display area PA1.

In the present exemplary embodiment, the source driving chip 310 is mounted on the flexible circuit board 320 in a tape carrier package (TCP) method, but other configurations are possible. For example, the source driving chip 310 may be mounted on the first substrate 110 in a chip-on-glass (COG) method.

The pixels PX arranged in the display area DA are partitioned by a partition wall 115 disposed on the first substrate 110. The partition wall 115 is extended to the second non-display area PA2 to cover the gate driver 200. This configuration will be described in detail later.

Figure 2:
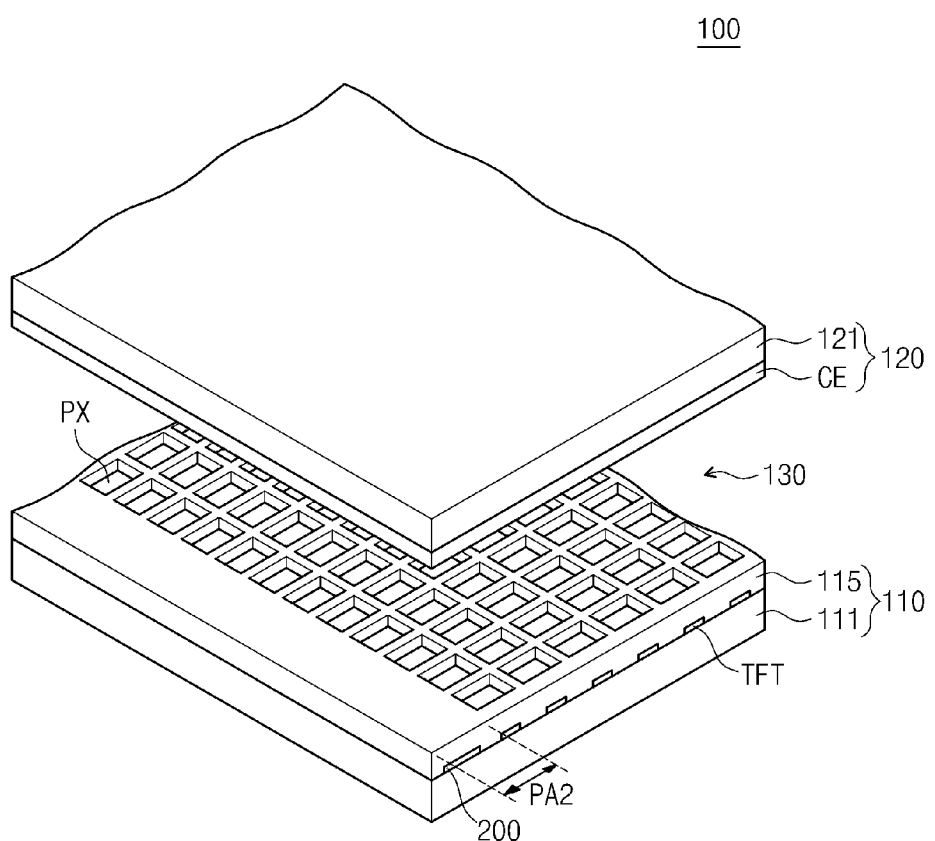
FIG. 2 is a perspective view showing a display panel shown in FIG. 1.

FIG. 2 is a perspective view showing a display panel shown in FIG. 1.

Referring to FIG. 2, the display panel 100 includes the first and second substrates 110 and 120 facing each other, and the electrowetting layer 130 disposed between the first and second substrates 110 and 120.

The electrowetting layer 130 is accommodated in each pixel PX partitioned by the partition wall 115 and includes a first fluid and a second fluid, which are immiscible with each other. The first fluid is not electrically conductive or polarizable, and the second fluid is electrically conductive and polarizable. The second fluid is disposed between the first and second substrates 110 and 120 in the non-display area.

The first substrate 110 of the display panel 100 includes a first base substrate 111, electronic devices TFT disposed on the first base substrate 111, the gate driver 200 disposed on the first base substrate 111, and the partition wall 115 disposed on the first base substrate 111. The partition wall 115 partitions the pixels PX arranged in the display area DA and is extended to the second non-display area PA2 to cover the gate driver 200. Although FIG. 2 shows the height of the partition wall 115 to be the same in both the display area DA and the second non-display area PA2, this is not required and the height may be different in these two areas.

The electronic devices TFT are disposed in the display area DA of the display panel 100. Each electronic device TFT may be configured to include a thin film transistor that includes a gate electrode connected to a corresponding gate line of the gate lines GL1 to GLn, a source electrode connected to a corresponding data line of the data lines DL1 to DLm, and a drain electrode connected to a pixel electrode (not shown). This configuration of the electronic devices TFT will be described in detail with reference to FIG. 8.

The second substrate 120 includes a second base substrate 121 facing the first base substrate 111 and a common electrode CE disposed on the second base substrate 121 to receive the common voltage. Although not shown in FIG. 2, the second substrate 120 corresponding to the first and second non-display areas PA1 and PA2 further includes a black matrix disposed on the second base substrate 121, and the second substrate 120 corresponding to the display area DA further includes the black matrix disposed on the second base substrate 121 and a color filter. The configuration of the second substrate 120 will be described in detail with reference to FIGS. 6 to 8.

The first base substrate 111 and the second base substrate 121 may be a transparent insulator and formed of a polymer, e.g., glass or plastic.

In the case where the first and second base substrates 111 and 121 are formed of plastic, each of the first and second base substrates 111 and 121 may include polyethylene terephthalate (PET), fiber reinforced plastic (FRP), or polyethylene naphthalate (PEN). In addition, when each of the first and second base substrates 111 and 121 is formed of plastic, the first and second base substrates 111 and 121 may be flexible.

Figure 3:
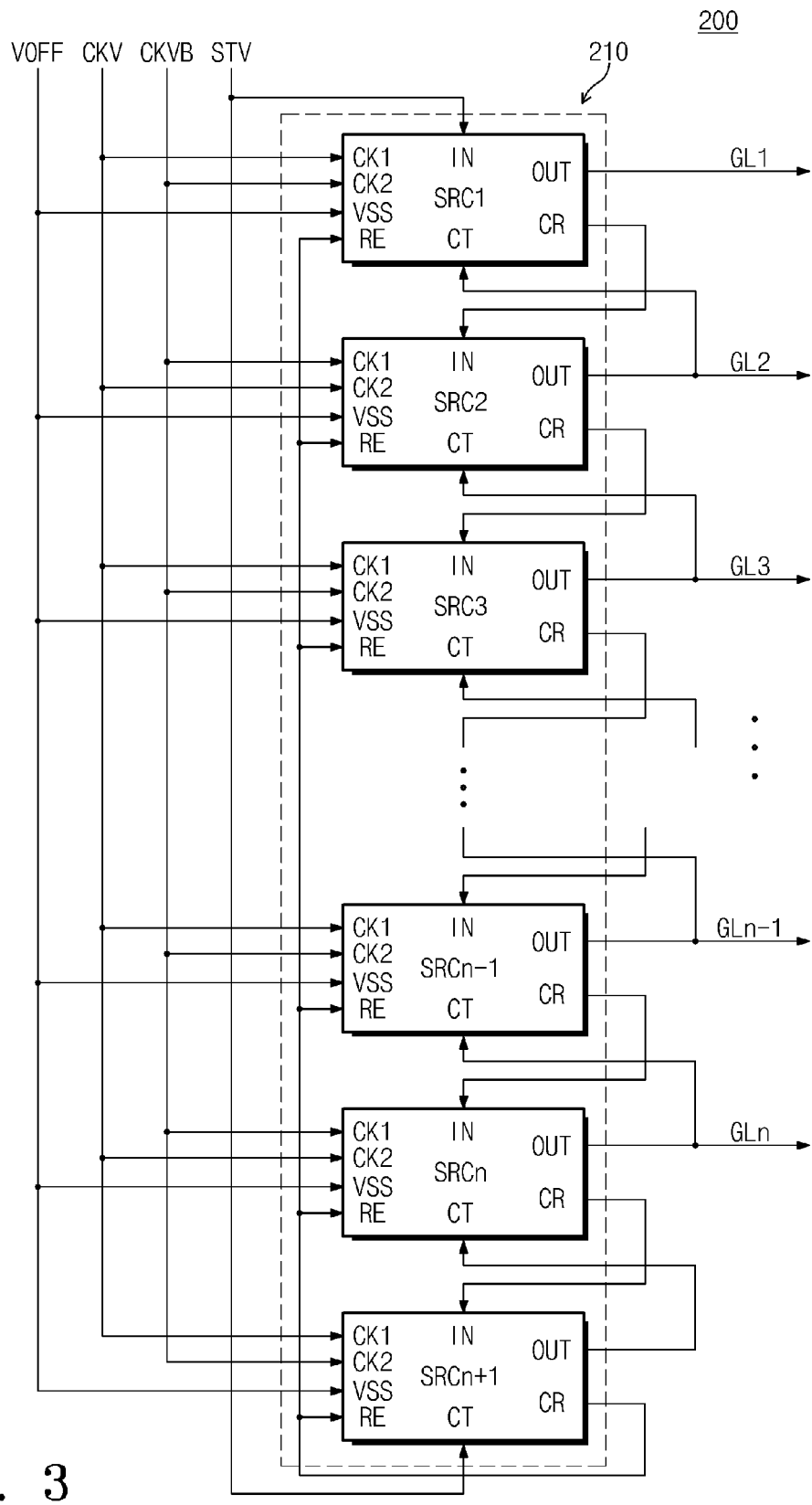
FIG. 3 is a block diagram showing a gate driver shown in FIG. 1.

FIG. 3 is a block diagram showing the gate driver shown in FIG. 1.

Referring to FIG. 3, the gate driver 200 includes a shift register 210 in which the plural stages SRC1 to SRCn+1 are connected to each other one after another. The shift register 210 includes first to (n+1)th stages SRC1 to SRCn+1. The first to n-th stages SRC1 to SRCn are referred to as driving stages and the (n+1)th stage SRCn+1 is referred to as a dummy stage. The first to n-th stages SRC1 to SRCn are electrically connected to the first to n-th gate lines GL1 to GLn, respectively, to sequentially output the gate signals. The first to (n+1)th stages SRC1 to SRCn+1 may be defined as gate driving circuits.

Each of the stages SRC1 to SRCn+1 includes a first clock terminal CK1, a second clock terminal CK2, a ground voltage terminal VSS, a reset terminal RE, a control terminal CT, a carry terminal CR, an output terminal OUT, and an input terminal IN.

Clock signals having opposite phases are applied to the first clock terminal CK1 and the second clock terminal CK2 of each stage SRC1 to SRCn+1. For instance, a first clock signal CKV is applied to the first clock terminal CK1 of each of odd-numbered stages SRC1, SRC3, . . . , SRCn−1 and a second clock signal CKVB having a phase opposite that of the first clock signal CKV is applied to the second terminal CK2 of each of odd-numbered stages SRC1, SRC3, . . . , SRCn−1. In contrast, the second clock signal CKVB is applied to the first clock terminal CK1 of each of even-numbered stages SRC2, SRC4, . . . , SRCn and the first clock signal CKV is applied to the second terminal CK2 of each of even-numbered stages SRC2, SRC4, . . . , SRCn.

A vertical start signal STV is applied to the input terminal IN of the first stage SRC1. A carry signal output from the carry terminal CR of a previous stage is applied to the input terminals IN of each of the second to (n+1)th stages SRC2 to SRCn+1. The carry signal output from the carry terminal CR is used to drive a next stage.

A gate signal output from the output terminal OUT of the next stage is applied to the control terminal CT of each of the first to n-th stages SRC1 to SRCn. The control terminal CT of the dummy stage SRCn+1 receives the vertical start signal STV.

An off voltage, which may be a ground voltage, is applied to the ground voltage terminal VSS of each of the stages SRC1 to SRCn+1. The carry signal output from the carry terminal CR of the dummy stage SRCn+1 is applied to the reset terminal RE of each of the stages SRC1 to SRCn+1.

Each of the clock signals CKV and CKVB may be a gate-on voltage at a logic high level or a gate-off voltage at a logic low level.

The output terminal OUT of each of the stages SRC1 to SRCn+1 outputs the clock signal applied to the first clock terminal CK1 having the logic high level. That is, the output terminal OUT of the odd-numbered stages SRC1, SRC3, . . . , SRCn−1 outputs the first clock signal CKV at a high logic level, and the output terminal OUT of the even-numbered stages SRC2, SRC4, . . . , SRCn outputs the second clock signal CKVB at a high logic level.

The carry terminal CR of each of the stages SRC1 to SRCn+1 outputs the carry signal on the basis of the same clock signal as that output from the output terminal OUT.

The clock signals CKV and CKVB and the start signal STV, which are applied to the shift register 210, are provided from the timing controller, and the off voltage VOFF is provided from a voltage converter (not shown).

Figure 4:
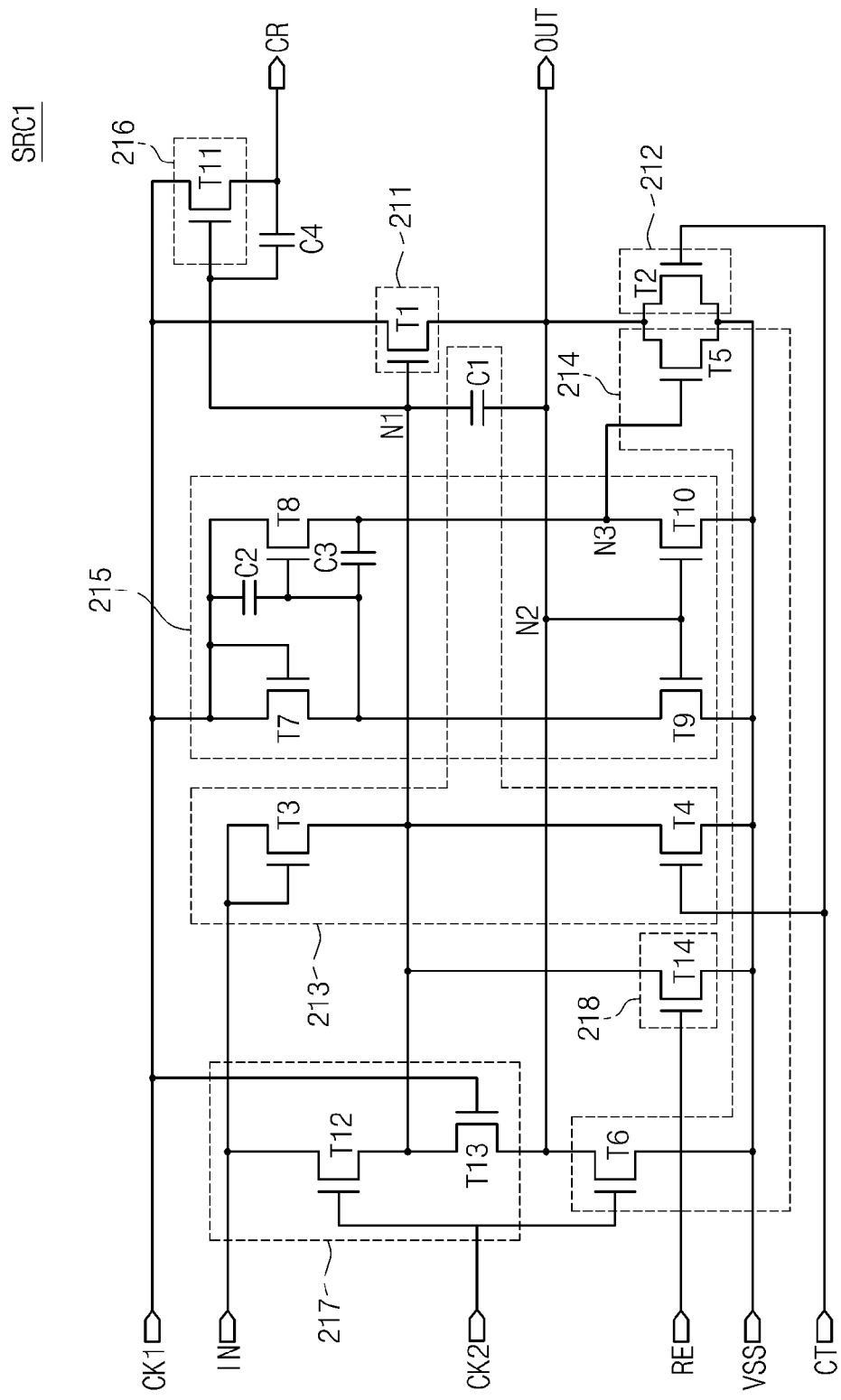
FIG. 4 is a circuit diagram showing a first stage shown in FIG. 3.

FIG. 4 is a circuit diagram showing a first stage shown in FIG. 3.

In the present exemplary embodiment, the first stage SRC1 shown in FIG. 3 has the same circuit configuration as the second to (n+1)th stages SRC2 to SRCn+1. Accordingly, the circuit configuration of the first stage SRC1 will be described in detail as a representative example, and detailed descriptions of the second to (n+1)th stages SRC2 to SRCn+1 will be omitted.

Referring to FIG. 4, the first stage SRC1 includes a pull-up part 211, a pull-down part 212, a drive part 213, a hold part 214, a switch part 215, and a carry part 216.

Hereinafter, the gate signals output from the first to (n+1)th stages SRC1 to SRCn+1 are referred to as first to (n+1)th gate signals, respectively.

The pull-up part 211 pulls up the first clock signal CKV provided through the first clock terminal CK1 and outputs the first clock signal CKV through the output terminal OUT as the first gate signal. The pull-up part 211 includes a first transistor T1 that includes a gate electrode connected to a first node N1, a drain electrode connected to the first clock terminal CK1, and a source electrode connected to the output terminal OUT.

The second gate signal output from the output terminal OUT of the second stage SRC2 is applied to the control terminal CT. Accordingly, responsive to the second gate signal of the second stage SRC2, the pull-down part 212 pulls down the pulled-up first gate signal to the off voltage VOFF provided through the ground voltage terminal VSS. The pull-down part 212 includes a second transistor T2 that includes a gate electrode connected to the control terminal CT, a drain electrode connected to the output terminal OUT, and a source electrode connected to the ground voltage terminal VSS.

The drive part 213 turns on the pull-up part 211 in response to the vertical start signal STV provided through the input terminal IN, and turns off the pull-up part 211 in response to the second gate signal of the second stage SRC2. To this end, the drive part 213 includes a buffer part, a charge part, and a discharge part.

The buffer part includes a third transistor T3 that includes gate and drain electrodes commonly connected to the input terminal IN, and a source electrode connected to the first node N1. The charge part includes a first capacitor C1 that includes a first electrode connected to the first node N1 and a second electrode connected to the second node N2. The discharge part includes a fourth transistor T4 that includes a gate electrode connected to the control terminal CT, a drain electrode connected to the first node N1, and a source electrode connected to the ground voltage terminal VSS.

The third transistor T3 is turned on in response to the vertical start signal STV provided through the input terminal IN, and thus the first capacitor C1 is charged with the vertical start signal STV. When the first capacitor C1 is charged with a voltage greater than a threshold voltage of the first transistor T1, the first transistor T1 is turned on. The turned-on first transistor T1 outputs the first clock signal, which is provided through the first clock terminal CK1, to the output terminal OUT.

The voltage at the first node N1 is boot-strapped by a coupling capacitance of the first capacitor C1 according to a variation of the voltage at the second node N2 as the variation of the voltage at the second node N2. Thus, the first transistor T1 may output the first clock signal CK1 applied to the drain electrode through the output terminal OUT with ease.

The first clock signal CKV output through the output terminal OUT is the first gate signal applied to the first gate line GL1. The vertical start signal STV is used to precharge the first transistor T1 so as to generate the first gate signal.

Then, the fourth transistor T4 is turned on in response to the second gate signal of the second stage SRC2, which is provided through the control terminal CT. When the fourth transistor T4 is turned on, the voltage charged in the first capacitor C1 is discharged to the level of the off voltage VOFF provided through the ground voltage terminal VSS.

The hold part 214 includes fifth and sixth transistors T5 and T6 to hold the first gate signal to the level of the off voltage VOFF. The fifth transistor T5 includes a gate electrode connected to a third node N3, a drain electrode connected to the second node N2, and a source electrode connected to the ground voltage terminal VSS. The sixth transistor T6 includes a gate electrode connected to the second clock terminal CK2, a drain electrode connected to the second node, and a source electrode connected to the ground voltage terminal VSS.

The switch part 215 includes seventh, eighth, ninth, and tenth transistors T7, T8, T9, and T10 and second and third capacitors C2 and C3 to control a drive of the hold part 214.

The seventh transistor T7 includes gate and drain electrodes connected to the first clock terminal CK1 and a source electrode connected to the third node N3 through the third capacitor C3. The eighth transistor T8 includes a drain electrode connected to the first clock terminal CK1, a gate electrode connected to the drain electrode of the eighth transistor T8 through the second capacitor C2, and a source electrode connected to the third node N3. In addition, the source and gate electrodes of the eighth transistor T8 are connected to each other through the third capacitor C3. The ninth transistor T9 includes a drain electrode connected to the source electrode of the seventh transistor T7, a gate electrode connected to the second node N2, and a source electrode connected to the ground voltage terminal VSS. The tenth transistor T10 includes a drain electrode connected to the third node N3, a gate electrode connected to the second node N2, and a source electrode connected to the ground voltage terminal VSS.

When the clock signal at a high logic level is output through the output terminal OUT as the first gate signal, the voltage at the second node N2 increases to a high level. The ninth and tenth transistors T9 and T10 are switched to the turn-on state when the voltage at the second node N2 increases to a high level. Accordingly, the seventh and eighth transistors T7 and T8 are switched to the turn-on state by the first clock signal CKV applied to the first clock terminal CK1, and signals output from the seventh and eighth transistors T7 and T8 are discharged to the off voltage VOFF through the ninth and tenth transistors T9 and T10. Thus, the voltage at the third node N3 is maintained at a low level. As a result, the fifth transistor T5 is maintained in the turn-off state.

Then, the first gate signal is discharged through the ground voltage terminal VSS in response to the second gate signal of the second stage SRC2 input through the control terminal CT, and the voltage at the second node N2 decreases to a low level. Accordingly, the ninth and tenth transistors T9 and T10 are switched to the turn-off state, and the voltage at the third node N3 increases to a high level by the signal output through the seventh and eighth transistors T7 and T8. Because the voltage at the third node N3 increases, the fifth transistor T5 is turned on, and the voltage at the second node N2 is discharged to the off-voltage VOFF through the fifth transistor T5.

When the sixth transistor T6 is turned on in response to the second clock signal CKVB applied to the second clock terminal CK2, the voltage at the second node N2 is increasingly discharged through the ground voltage terminal VSS.

Consequently, the fifth and sixth transistors T5 and T6 of the hold part 214 hold the voltage at the second node N2 to the off voltage VOFF. The switch part 215 determines a turn-on timing of the fifth transistor T5.

The carry part 216 includes an eleventh transistor T11 that includes a drain electrode connected to the first clock terminal CK1, a gate electrode connected to the first node N1, and a source electrode connected to the carry terminal CR. The eleventh transistor T11 is turned on by the increase of the voltage at the first node N1 and outputs the first clock signal CKV, which is applied to the drain electrode thereof, through the carry terminal CR.

The first stage SRC1 further includes a ripple prevent part 217 and a reset part 218. The ripple prevent part 217 prevents the first gate signal maintained in the off voltage VOFF from having a ripple component generated by noise input through the input terminal IN. To this end, the ripple prevent part 217 includes a twelfth transistor T12 and a thirteenth transistor T13. The twelfth transistor T12 includes a drain electrode connected to the input terminal IN, a gate electrode connected to the second clock terminal CK2, and a source electrode connected to the first node N1. The thirteenth transistor T13 includes a drain electrode connected to the first node N1, a gate electrode connected to the first clock terminal CK1, and a source electrode connected to the second node N2.

The reset part 218 includes a fourteenth transistor T14 that includes a drain electrode connected to the first node N1, a gate electrode connected to the reset terminal RE, and a source electrode connected to the ground voltage terminal VSS. The fourteenth transistor T14 discharges the first node N1 to the off voltage VOFF in response to the (n+1)th gate signal of the (n+1)th stage SRCn+1 provided through the reset terminal RE. The output of the (n+1)th gate signal of the (n+1)th stage SRCn+1 means that one frame is finished, so that the reset part 218 discharges the first node N1 of each of the stages SRC1 to SRCn+1.

That is, the fourteenth transistor T14 of the reset part 218 of each of the stages SRC1 to SRCn+1 is turned on by the output signal of the (n+1)th stage SRCn+1 after the first to n-th gate signals are sequentially output from the first to n-th stages SRC1 to SRCn. Accordingly, the first node N1 of each of the stages SRC1 to SRCn+1 is reset to the off voltage VOFF by the reset part 218. As a result, the stages SRC1 to SRCn+1 of the shift register 210 may start its operation from the initial state thereof.

Figure 5:
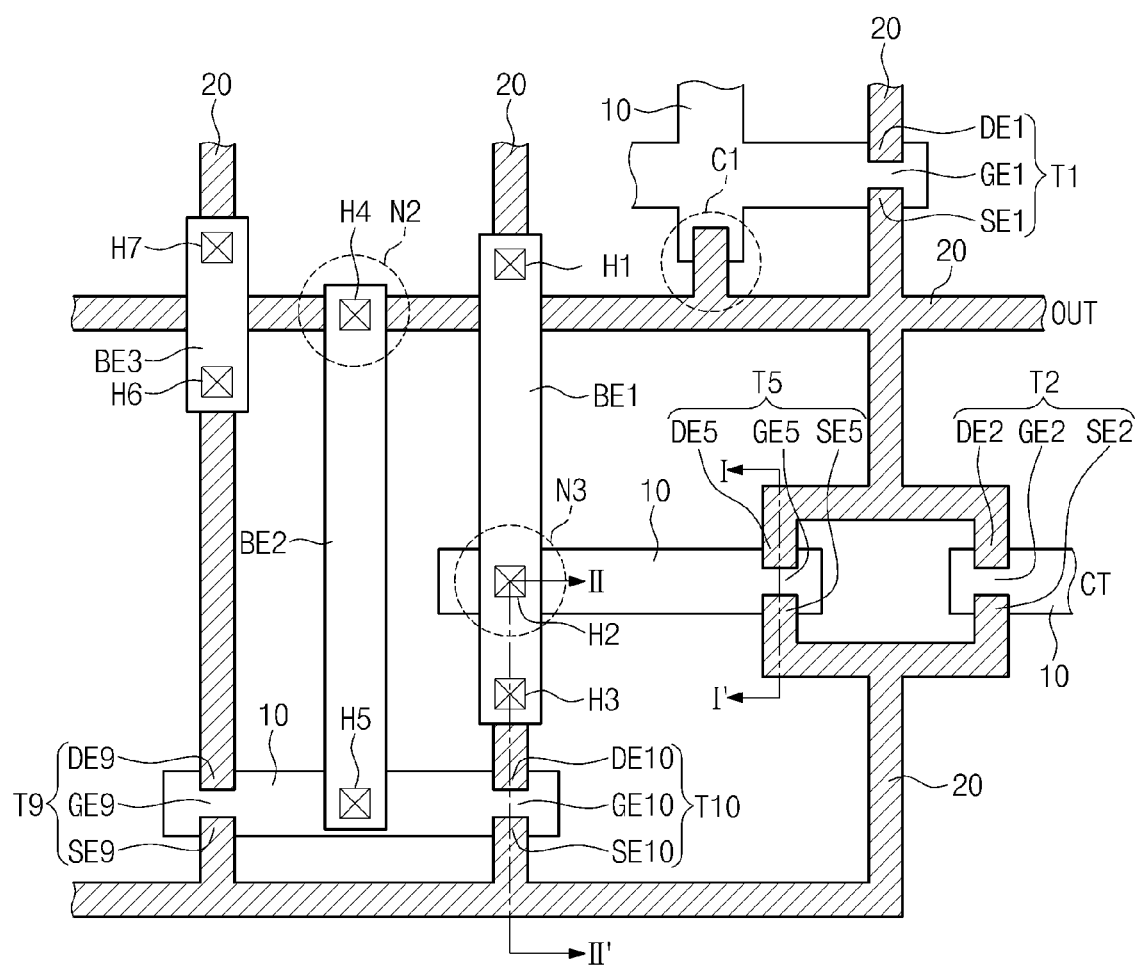
FIG. 5 is a plan view showing a portion of the circuit diagram of the first stage shown in FIG. 4.
Figure 6:
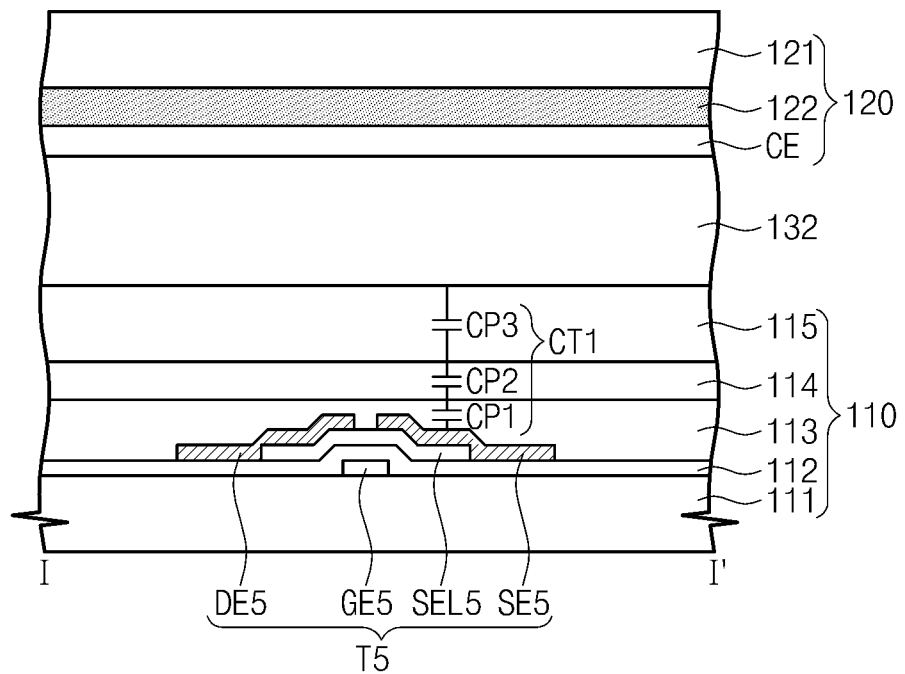
FIG. 6 is a cross-sectional view taken along a line I-I' shown in FIG. 5.
Figure 7:
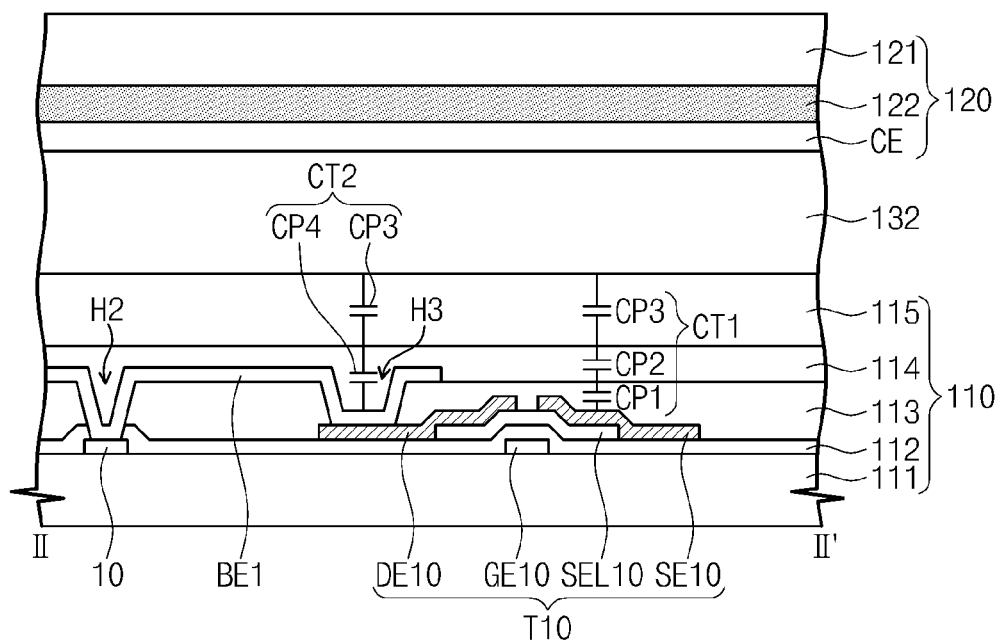
FIG. 7 is a cross-sectional view taken along a line II-II' shown in FIG. 5.

FIG. 5 is a plan view showing a portion of the circuit diagram of the first stage shown in FIG. 4, FIG. 6 is a cross-sectional view taken along a line I-I' shown in FIG. 5, and FIG. 7 is a cross-sectional view taken along a line II-II' shown in FIG. 5.

FIG. 5 shows the second, fifth, eighth, and tenth transistors of the first stage, and FIGS. 6 and 7 explain a parasitic capacitance generated by transistors of the gate driver and a parasitic capacitance generated by bridge electrodes that connect the transistors.

Referring to FIG. 5, the first stage includes gate electrodes of the transistors, first conductive patterns 10 extended from the gate electrodes, source and drain electrodes of the transistors, and second conductive patterns 20 extended from the source and drain electrodes.

Each of the first conductive patterns 10 is substantially simultaneously patterned with the gate electrode of the electronic device TFT of the pixel PX. Each of the second conductive pattern 20 is substantially simultaneously patterned with the source and drain electrodes of the electronic device TFT of the pixel PX. A gate insulating layer is formed between the first conductive patterns 10 and the second conductive patterns 20 and a semiconductor layer is formed on the gate insulating layer. This structure will be described in detail with reference to FIGS. 6 and 7.

The first conductive patterns 10 form the gate electrodes of the transistors of the first stage. For instance, the gate electrodes of the first, second, fifth, ninth, and tenth transistors T1, T2, T5, T9, and T10 shown in FIG. 5 are formed by the first conductive patterns 10. In addition, each of the first conductive patterns 10 may be extended in the area in which the gate electrode is formed along the signal line shown in FIG. 4. For example, the first conductive pattern 10 that forms the gate electrode GE10 of the tenth transistor T10 is extended in a horizontal direction to form the gate electrode GE9 of the ninth transistor T9. The gate electrodes of the other transistors not shown in FIG. 5 may be formed by the first conductive patterns 10.

The second conductive patterns 20 form the source and drain electrodes of the transistors of the first stage. For instance, the source and drain electrodes of the first, second, fifth, ninth, and tenth transistors T1, T2, T5, T9, and T10 shown in FIG. 5 are formed by the second conductive patterns 20. In addition, each of the second conductive patterns 20 may be extended in the area in which the source and drain electrodes are formed along the signal line shown in FIG. 4. For example, the second conductive pattern 20 that forms the source electrode SE1 of the first transistor T1 is extended to form the drain electrode DE5 of the fifth transistor T5, the drain electrode DE2 of the second transistor T2, and the output terminal OUT. In addition, the second conductive pattern 20 that forms the source electrodes SE2 and SE5 of the second and fifth transistors T2 and T5 is extended to form the source electrodes SE9 and SE10 of the ninth and tenth transistors T9 and T10.

The gate electrode and the source and drain electrodes may be electrically connected to each other by the bridge electrodes. In detail, the gate electrode GE5 of the fifth transistor T5 shown in FIG. 4 is connected to the drain electrode DE10 of the tenth transistor T10. In this case, as shown in FIG. 5, the gate electrode GE5 of the fifth transistor T5 is extended and electrically connected to a first bridge electrode BE1 through a second contact hole H2, and the drain electrode DE10 of the tenth transistor T10 is extended and electrically connected to the first bridge electrode BE1 through a third contact hole H3.

The first bridge electrode BE1 and second and third bridge electrodes BE2 and BE3 shown in FIG. 5 may be substantially simultaneously patterned with the pixel electrode of the pixel PX. The first, second, and third bridge electrodes BE1, BE2, and BE3 are formed on a protective layer that covers the transistors. The bridge electrodes may be formed of the same conductive material as the pixel electrode.

The first and second conductive patterns 10 and 20 are electrically connected to each other by the bridge electrodes, and the second conductive patterns 20 are electrically connected to each other by the bridge electrodes. In detail, the gate electrodes GE9 and GE10 of the ninth and tenth transistors T9 and T10 shown in FIG. 4 and the output terminal OUT are connected to the second node N2. In this case, as shown in FIG. 5, the first conductive pattern 10 used to form the gate electrodes GE9 and GE10 of the ninth and tenth transistors T9 and T10 is electrically connected to the second bridge electrode BE2 through a fifth contact hole H5. In addition, the second conductive pattern 20 used to form the output terminal OUT is electrically connected to the second bridge electrode BE2 through the fourth contact hole H4.

The drain electrode DE9 of the ninth transistor T9 is connected to the source electrode of the seventh transistor T7 and not connected to the signal line of the output terminal OUT. In this case, as shown in FIG. 5, the second conductive pattern 20 used to form the drain electrode DE9 of the ninth transistor T9 is electrically connected to the third bridge electrode BE3 through a sixth contact hole H6. In addition, the second conductive pattern 10 used to form the source electrode of the seventh transistor T7 is electrically connected to the third bridge electrode BE3 through a seventh contact hole H7.

The first capacitor C1 is formed in an area in which the first conductive pattern 10 used to form the gate electrode GE1 of the first transistor T1 is overlapped with the second conductive pattern 20 used to form the source electrode SE1 of the first transistor T1.

FIG. 6 shows a cross-sectional structure of the fifth transistor, and the other transistors have the substantially same structure as the fifth transistor.

Referring to FIG. 6, the gate electrode GE5 of the fifth transistor T5 is formed on the first base substrate 111, and a gate insulating layer 112 is formed on the first base substrate 111 to cover the gate electrode GE5. A semiconductor layer SEL5 is formed on the gate insulating layer 112 that covers the gate electrode GE5. Although not shown in FIG. 6, the semiconductor layer SEL5 includes an active layer and an ohmic contact layer. The source electrode SE5 and the drain electrode DE5 of the fifth transistor T5 are formed on the semiconductor layer SEL5 and the gate insulating layer 112 and are spaced apart from each other.

The source electrode SE5 and the drain electrode DE5 of the fifth transistor T5 are covered by a protective layer 113. The protective layer 113 may have a single-layer structure or a multi-layer structure. When the protective layer 113 has the multi-layer structure, the protective layer 113 may include an organic insulating layer and an inorganic insulating layer formed on the organic insulating layer. When the protective layer 113 has a single-layer structure, the protective layer 113 may include an inorganic insulating layer of silicon nitride (SiNx).

An insulating layer 114 is formed on the protective layer 113, and a partition wall 115 is formed on the insulating layer 114. The partition wall 115 may be formed of a photoresist and insulating layers, e.g., SiNx, SiOx, etc.

As described above, a black matrix 122 is formed on the second base substrate 121 corresponding to the first and second non-display areas PA1 and PA2. That is, the black matrix 122 is formed on the second base substrate 121 corresponding to the second non-display area PA2 of the display panel 100 in which the gate driver 200 is formed. Accordingly, as shown in FIG. 6, the second substrate 120 includes the second base substrate 121, the black matrix 122 formed on the second base substrate 121, and the common electrode CE formed on the black matrix 122.

As described above, the electrically conductive and polarizable second fluid 132 is formed between the first substrate 110 and the second substrate 120 in the non-display area.

When the common voltage is applied to the common electrode CE, current flows through the second fluid 132. Thus, the second fluid 132 may serve as an electrode. The parasitic capacitance is formed in a dielectric substance disposed between the electrodes having the electrical conductivity. In a case that the dielectric substance is provided between the electrodes in a plural number, the parasitic capacitance may be formed in each dielectric substance.

The drain and source electrodes DE5 and SE5 of the fifth transistor T5 are electrically conductive. In addition, the second fluid 132 is electrically conductive. The protective layer 113, the insulating layer 114, and the partition wall 115 may be formed of an insulating layer, and thus the protective layer 113, the insulating layer 114, and the partition wall 115 serve as the dielectric substance. Therefore, as shown in FIG. 6, a parasitic capacitance is formed between the source electrode SE5 of the fifth transistor T5 and the second fluid 132.

In detail, a first parasitic capacitor CP1 is formed in the protective layer 113 between the source electrode SE5 and the second fluid 132, a second parasitic capacitor CP2 is formed in the insulating layer 114, and a third parasitic capacitor CP3 is formed in the partition wall 115. The first to third parasitic capacitors CP1 to CP3 are connected to each other in series.

Although not shown in FIG. 6, the same parasitic capacitance as the parasitic capacitance formed between the source electrode SE5 of the fifth transistor T5 and the second fluid 132 may be formed between the drain electrode DE5 of the fifth transistor T5 and the second fluid 132.

A total capacitance of the parasitic capacitance formed between the source electrode SE5 of the fifth transistor T5 and the second fluid 132 is obtained by the following Equation 1.

$$1/CT1 = 1/CP1 + 1/CP2 + 1/CP3 \qquad \text{Equation 1}$$

As the number of the capacitors connected to each other in series increases, the total capacitance of all of the connected capacitors decreases. In a case that the partition wall 115 is not formed on the insulating layer 114, the first and second parasitic capacitors CP1 and CP2 are formed in the protective layer 113 and the insulating layer 114, respectively, between the source electrode SE5 of the fifth transistor T5 and the second fluid 132. That is, when the partition wall 115 is not formed on the insulating layer 114, the total capacitance of the parasitic capacitors formed between the source electrode SE5 and the second fluid 132 is greater than the total capacitance of the parasitic capacitors formed between the source electrode SE5 and the second fluid 132 when the partition wall 115 is formed on the insulating layer 114.

Because a signal delay is determined by a time constant ($\tau = RC$), the signal delay is proportional to the total capacitance of the capacitors. Accordingly, as the capacitance of the parasitic capacitors formed in the stages SRC1 to SRCn+1 increases, the signal delay is increased. As a result, the gate signal output through the output terminal OUT may be delayed. When the gate signal is delayed, the pixels PX are malfunctioned and display defects occur.

However, the electrowetting display device 500 includes the partition wall 115 formed in the second non-display area PA2 to cover the gate driver 200. That is, because the partition wall 115 is formed on the insulating layer 114, the third parasitic capacitor CP3 is formed by the partition wall 115, as shown in FIG. 6. As a result, the total capacitance of the parasitic capacitors of the gate driver 200 may be lower when the partition wall 115 is formed on the insulating layer 114 than that when the partition wall 115 is not formed on the insulating layer 114. When the total capacitance of the parasitic capacitors is reduced, the gate signals output from the stages SRC1 to SRCn+1 may be prevented from being delayed. Thus, the pixels PX may be normally operated.

Devices, e.g., transistors, included in the gate driver 200 may be corroded by moisture infiltration to the gate driver 200. However, the electrowetting display device 500 includes the partition wall 115 formed to cover the gate driver 200. That is, the transistors included in the gate driver 200 may be protected from the moisture by the partition wall 115 formed on the insulating layer 114. In other words, because the partition wall 115 covers the gate driver 200, the transistors included in the gate driver 200 may be prevented from being corroded by the moisture infiltrated into the gate driver 200.

Consequently, the electrowetting display device 500 reduces the total parasitic of the gate driver 200 so as to prevent the occurrence of the display defects and corrosion of the devices in the gate driver 200.

FIG. 7 shows a connection relationship between the first conductive pattern 10 extended from the gate electrode GE5 of the fifth transistor T5 and the tenth transistor T10. In detail, FIG. 7 explains the parasitic capacitance formed by the bridge electrodes.

Referring to FIG. 7, the gate electrode GE10 of the tenth transistor T10 and the first conductive pattern 10 extended from the gate electrode GE5 of the fifth transistor T5 are formed on the first base substrate 111. The gate insulating layer 112 is formed on the first base substrate 111 to cover the gate electrode GE10 of the tenth transistor T10 and the first conductive pattern 10 extended from the gate electrode GE5 of the fifth transistor T5.

The tenth transistor T10 has substantially the same configuration as that of the fifth transistor T5 shown in FIG. 6.

The protective layer 113 covers the source electrode SE10 and the drain electrode DE10 of the tenth transistor T10 and the first bridge electrode BE1 is formed on the protective layer 113. The first bridge electrode BE1 is electrically connected to the drain electrode DE10 of the tenth transistor T10 through the third contact hole H3 formed through the protective layer 113. In addition, the first bridge electrode BE1 is electrically connected to the first conductive pattern 10 extended from the gate electrode GE5 of the fifth transistor T5 through the second contact hole H2 formed through the protective layer 113 and the gate insulating layer 112.

As a result of the above-mentioned configuration, the drain electrode DE10 of the tenth transistor T10 is electrically connected to the gate electrode GE5 of the fifth transistor T5.

The gate insulating layer 114 is formed on the protective layer 113 to cover the first bridge electrode BE1, and the partition wall 115 is formed on the insulating layer 114. The second substrate 120 shown in FIG. 7 has substantially the same configuration as that of the second substrate 120 shown in FIG. 6, so details of the second substrate 120 shown in FIG. 7 will be omitted.

The first bridge electrode BE1 and the second fluid 132 are electrically conductive. As described above, the insulating layer 114 and the partition wall 115 are formed of the insulating layer, and thus the insulating layer 114 and the partition wall 115 serve as the dielectric substance. Accordingly, parasitic capacitance is formed between the first bridge electrode BE1 and the second fluid 132. In detail, a fourth parasitic capacitor CP4 is formed in the insulating layer 114 between the first bridge electrode BE1 and the second fluid 132, and the third parasitic capacitor CP3 is formed in the partition wall 115.

A thickness of the insulating layer 114 disposed between the organic layer 113 and the partition wall 115 may be different from a thickness of the first bridge electrode BE1 and the partition wall 115. Thus, the parasitic capacitance formed in the insulating layer 114 between the first bridge electrode BE1 and the second fluid 132 is referred to as the fourth parasitic capacitor CP4.

The third and fourth parasitic capacitors CP3 and CP4 are connected to each other in series. A total capacitance CT2 of the parasitic capacitors formed between the first bridge electrode BE1 and the second fluid 132 is obtained by the following Equation 2.

$$1/CT2 = 1/CP3 + 1/CP4 \qquad \text{Equation 2}$$

As described above, as the number of the capacitors connected to each other in series increases, the total capacitance of all of the capacitors decreases, and the signal delay is proportional to the total capacitance of the capacitors.

When the partition wall 115 is not formed on the insulating layer 114, the second parasitic capacitor CP2 is formed in the insulating layer 114 between the first bridge electrode BE1 and the second fluid 132. That is, when the partition wall 115 is not formed on the insulating layer 114, the total capacitance of the parasitic capacitors formed between the first bridge electrode BE1 and the second fluid 132 is greater than the total capacitance CT2 of the parasitic capacitors formed between the first bridge electrode BE1 and the second fluid 132 when the partition wall 115 is formed on the insulating layer 114.

In other words, the electrowetting display device 500 includes the partition wall 115 formed in the second non-display area PA2 to cover the gate driver 200, and the third parasitic capacitor CP3 is formed by the partition wall 115, as shown in FIG. 7. As a result, the total capacitance of the parasitic capacitors of the gate driver 200 may be lower when the partition wall 115 is formed on the insulating layer 114 than the total capacitance when the partition wall 115 is not formed on the insulating layer 114. Because the total capacitance of the parasitic capacitors is reduced, the gate signals output from the stages SRC1 to SRCn+1 may be prevented from being delayed. Thus, the pixels PX may be normally operated.

In addition, as described above, because the partition wall 115 covers the gate driver 200, the transistors included in the gate driver 200 may be prevented from being corroded by the moisture infiltrated into the gate driver 200.

Consequently, the electrowetting display device 500 reduces the capacitance of the parasitic capacitors of the gate driver 200, thereby preventing the occurrence of the display defects and the corrosion of the devices in the gate driver 200.

Figure 8:
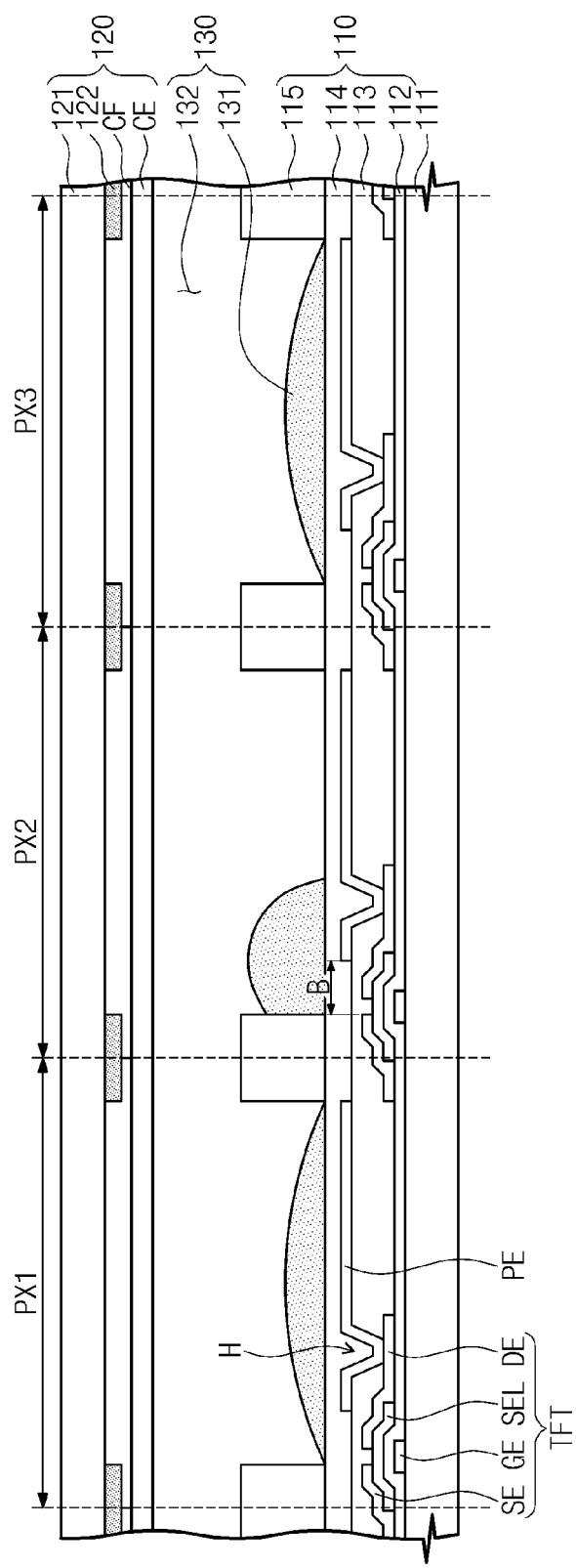
FIG. 8 is a cross-sectional view showing a pixel shown in FIG. 2.

FIG. 8 is a cross-sectional view showing a pixel shown in FIG. 2.

For the convenience of explanation, FIG. 8 shows only the first, second, and third pixels, and the other pixels have the same configuration as the first, second, and third pixels shown in FIG. 8.

Referring to FIG. 8, a side area of each of the first, second, and third pixels PX1, PX2, and PX3 may be defined by dotted lines. Accordingly, the first and second substrates 110 and 120 may share the area of each of the first to third pixels PX1 to PX3 as shown in FIG. 8. Because the area of each of the first to third pixels PX1 to PX3 is commonly shared by the first substrate 110 and the second substrate 120, the area of each of the first to third pixels PX1 to PX3 may be defined on the first substrate 110.

That is, the display panel 100 of the display area DA includes the first substrate 110, the second substrate 120 facing the first substrate 110, and the electrowetting layer 130 disposed between the first and second substrates 110 and 120.

Each of the first to third pixels PX1 to PX3 includes the electronic device TFT and the pixel electrode PE connected to the electronic device TFT. The electronic device TFT is configured to include a thin film transistor and is formed on the first base substrate 111 of the first substrate 110. The first to third pixels PX1 to PX3 have the same configuration, and thus the configuration of the first pixel PX1 will be described in detail and detailed descriptions of the second and third pixels PX2 and PX3 will be omitted.

Although not shown in FIG. 8, the first pixel PX1 includes a gate line and a data line, where the gate signal is applied to the gate line and the data voltage is applied to the data line. The electronic device TFT includes the gate electrode GE branched from the corresponding gate line, the source electrode SE branched from the corresponding data line, and the drain electrode DE electrically connected to the pixel electrode PE.

The electronic device TFT is turned on in response to the gate signal provided through the gate line so as to apply the data voltage provided through the data line to the pixel electrode PE.

The gate electrode GE of the electronic device TFT is formed on the first base substrate 111. In addition, the gate insulating layer 112 is formed on the first base substrate 111 to cover the gate electrode GE of the electronic device TFT. The semiconductor layer SEL is formed on the gate insulating layer 112 that covers the gate electrode GE. Although not shown in FIG. 8, the semiconductor layer SEL includes the active layer and the ohmic contact layer. The source electrode SE and the drain electrode DE of the electronic device TFT are formed on the semiconductor layer SEL and the gate insulating layer 112 to be spaced apart from each other.

The protective layer 113 is formed on the gate insulating layer 112 to cover the electronic device TFT. The pixel electrode PE is formed on the protective layer 113. The pixel electrode PE is connected to the drain electrode DE of the electronic device TFT through the contact hole H formed through the protective layer 113.

The pixel electrode PE may be formed of a transparent conductive material, such as indium tin oxide, conductive polymer, carbon nanotube, etc.

The insulating layer 114 is formed on the protective layer 113 to cover the pixel electrode PE. The insulating layer 114 is surface-treated to have a hydrophobic property or includes an additional hydrophobic layer (not shown) to have the hydrophobic property. The partition wall 115 is formed on the insulating layer 114 to partition the pixels. The partition wall 115 in the display area may be formed of photoresist. In addition, the partition wall 115 may be formed by patterning the insulating layer, e.g., SiNx, SiOx, etc.

The second substrate 120 includes the second base substrate 121 facing the first base substrate 111, the black matrix 122 formed on the second base substrate 121, the color filter CF formed on the second base substrate 121, and the common electrode CE formed on the color filter CF. The color filter CF includes a color pixel representing a red, green, or blue color. The black matrix 122 is formed in a boundary area between the first to third pixels PX1 to PX3 and overlapped with the partition wall 115. The common voltage is applied to the common electrode CE, and the common electrode CE is formed of a transparent conductive material, e.g., indium tin oxide.

The electrowetting layer 130 is disposed in each pixel PX and includes the first fluid 131 and the second fluid 132, which are immiscible with each other. The first fluid 131 is not electrically conductive or polarizable, and the second fluid 132 is electrically conductive and polarizable. In addition, the first fluid 131 is hydrophobic and the second fluid 132 is hydrophilic. For instance, the first fluid 131 may include an organic solvent, such as silicon oil, mineral oil, carbon tetrachloride ($CCL_4$), etc. The second fluid 132 may include an aqueous solution and electrolyte, such as sodium chloride (NaCl).

The first fluid 131 includes a black dye or a material absorbing light to absorb the light incident thereto. In addition, the first fluid 131 is dispersed over the pixel PX or moves to a side portion of the first pixel PX1 so as to serve as a light shutter. The second fluid 132 may be transparent, and thus the second fluid 132 may transmit the light incident thereto.

The first fluid 131 and the second fluid 132 have different polarities from each other, and thus the first fluid 131 and the second fluid 132 are immiscible with and make contact with each other. The first fluid 131 is disposed on the insulating layer 114 in the first pixel PX1 partitioned by the partition wall 115 and the second fluid 132 is disposed on the first fluid 131.

As an example, the first fluid 131 includes a dye representing one of red, green, and blue colors or a material representing one of red, green, and blue colors. In this case, the color filter CF may be removed from the electrowetting display device 500.

FIG. 8 shows the configuration of the pixel of the electrowetting display device 500 used as a transmission type display device. However, the electrowetting display device 500 may be used as a reflection type display device.

Although not shown in figures, in a case that the electrowetting display device 500 is used as the reflection type display device, the electrowetting display device 500 may further include a reflective layer configured to include a reflective metal, e.g., aluminum and/or aluminum-neodymium. The reflective layer is disposed on the pixel electrode 112 or under the first substrate 110.

Hereinafter, the movement of the electrowetting layer, which is caused by the operation of the pixel, will be described with reference to the second pixel PX2 shown in FIG. 8.

The electronic device TFT of the second pixel PX2 is turned on in response to the gate signal provided through the corresponding gate line, and the turned-on electronic device TFT applies the data voltage, which is provided through the corresponding data line, to the pixel electrode PE. The common electrode CE is applied with the common voltage. In this case, the second fluid 132 is polarized and pushes out the first fluid 131 to the side portion of the second pixel PX2, and thus the second fluid 132 makes contact with the insulating layer 114.

The first fluid 131 that includes the organic solvent tends to gather. Accordingly, the first fluid 131 is pushed out to the side portion of the second pixel PX2 by the second fluid 132 and stably gathered in the side portion of the second pixel PX2.

For instance, because the pixel electrode PE is not formed in the first area B of the second pixel PX2 shown in FIG. 8, the electric field is not generated in the first area B. In addition, a distance between the pixel electrode PE and the common electrode CE in the area of the contact hole H is greater than a distance between the pixel electrode PE and the common electrode CE in the area of the second pixel PX2, except for the area of the contact hole H.

Accordingly, the electric field generated between the pixel electrode PE and the common electrode CE in the area of the contact hole H has a weaker intensity than that of the electric field generated between the pixel electrode PE and the common electrode CE in the area of the second pixel PX2, except for the area of the contact hole H. As a result, the first fluid 131 may be stably gathered in the area that includes the first area B and the area of the contact hole H. That is, as shown in FIG. 8, the first fluid 131 is pushed out to a left side portion of the second pixel PX2. In this case, light passes through the second fluid layer 132, and thus the second pixel PX2 displays an image.

The electrowetting display device 500 controls the movement of the first and second fluids 131 and 132 in response to a difference between voltages respectively applied to the pixel electrode PE and the common electrode CE, and displays the gray scale. The common voltage has a uniform voltage level and the data voltage corresponds to the gray scale displayed in the pixel. The pushed-out amount of the first fluid 131 depends on the level of the data voltage applied to the pixel electrode PE. Consequently, the pixels PX may display the gray scale corresponding to the data voltage applied to the pixel electrode PE through the electronic device TFT.

According to the above, the electrowetting display device reduces a parasitic capacitance of the gate driver 200 so as to prevent occurrence of display defects in the pixels.

In addition, because the partition wall 115 is formed to cover the gate driver 200, corrosion may be prevented in the devices included in the gate driver 200.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electrowetting display device comprising:
a peripheral area at least partially surrounding rows and columns of pixels,
a first substrate;
a second substrate facing the first substrate;
a fluid disposed between the first substrate and the second substrate;
a data driver configured to apply data signals to the rows and columns of pixels through a plurality of data lines;
a gate driver disposed at least partly in the peripheral area and configured to apply gate signals to the rows and columns of pixels through a plurality of gate lines, wherein the rows and columns of pixels are configured to receive the data signals in response to the gate signals and to display gray scales corresponding to the data signals; and
a single contiguous material layer that includes: (i) a grid structure comprising intersecting rows and columns of partition walls that partition the pixels, and (ii) a non-grid structure that at least partly covers the gate driver in the peripheral area, the pixels containing respective portions of the fluid.

2. The electrowetting display device of claim 1, wherein the gate driver comprises a plurality of gate driving circuits configured to sequentially output the gate signals, wherein each of the gate driving circuits comprises a plurality of transistors.

3. The electrowetting display device of claim 2, wherein the first substrate comprises:
a first base substrate on which the transistors are disposed;
a protective layer disposed on the first base substrate and covering the transistors; and
an insulating layer disposed on the protective layer,
wherein the intersecting rows and columns of partition walls are disposed on the insulating layer and covers the insulating layer.

4. The electrowetting display device of claim 3, wherein the protective layer comprises an organic insulating layer and an inorganic insulating layer disposed on the organic insulating layer.

5. The electrowetting display device of claim 3, wherein the protective layer comprises an inorganic insulating layer.

6. The electrowetting display device of claim 3, wherein the first substrate further comprises a bridge electrode disposed between the protective layer and the insulating layer and connecting at least two transistors among the plurality of transistors to each other.

7. The electrowetting display device of claim 6, wherein the bridge electrode is respectively connected to the at least two transistors through contact holes formed in the protective layer.

8. The electrowetting display device of claim 3, wherein the second substrate comprises:
a second base substrate facing the first base substrate;
a black matrix disposed on the second base substrate; and
a common electrode disposed on the black matrix and configured to receive a common voltage.

9. The electrowetting display device of claim 1, wherein the second substrate comprises a common electrode disposed thereon, the common electrode being configured to receive a common voltage.

10. The electrowetting display device of claim 9, wherein the individual pixels of the rows and columns of pixels comprises:
an electronic device connected to a corresponding gate line of the gate lines and a corresponding data line of the data lines;
a pixel electrode connected to the electronic device; and
an insulating layer disposed on the pixel electrode, and the intersecting rows and columns of partition walls are disposed on the insulating layer,
wherein the electronic device is configured to apply a corresponding data signal of the data signals to the pixel electrode in response to a corresponding gate signal of the gate signals.

11. The electrowetting display device of claim 10, wherein the electronic device comprises:
a gate electrode connected to a corresponding gate line of the gate lines;
a source electrode connected to a corresponding data line of the data lines; and
a drain electrode connected to the pixel electrode.

12. The electrowetting display device of claim 10, wherein a movement of the electrowetting layer is controlled by voltages respectively applied to the pixel electrode and the common electrode.

13. The electrowetting display device of claim 12, wherein the electrowetting layer comprises:
a first fluid which is not electrically conductive; and
a second fluid which is electrically conductive and which is immiscible with the first fluid,
wherein the second fluid is disposed on the insulating layer and accommodated in a space defined by the intersecting rows and columns of partition walls.

14. The electrowetting display device of claim 10, wherein individual pixels of the rows and columns of pixel further comprises a reflective layer disposed on the pixel electrode, the reflective layer comprising a reflective metal.

15. The electrowetting display device of claim 1, wherein the gate driver is disposed on the display panel in a gate driver circuit.

16. The electrowetting display device of claim 15, wherein the gate driver circuit comprises an amorphous silicon thin film transistor gate driver circuit.

17. The electrowetting display device of claim 3, wherein the protective layer comprises an insulating layer.

18. The electrowetting display device of claim 1, wherein the grid structure includes apertures formed by the intersecting rows and columns of partition walls and the non-grid structure is void of the apertures.

19. A display device comprising:
a substrate comprising a peripheral area at least partially surrounding rows and columns of pixels;
an electrically conductive and polarizable fluid disposed on the substrate;
a data driver configured to apply data signals to the pixels through a plurality of data lines; and
a gate driver disposed in the peripheral area and configured to apply gate signals to the pixels through a plurality of gate lines;
a first insulating layer disposed on the substrate in the peripheral area and on the gate driver;
a second insulating layer disposed in the peripheral area and on the first insulating layer and the gate driver; and
a single contiguous material layer having a grid structure disposed among the rows and columns of pixels, disposed in the peripheral area and having a non-grid structure, disposed on the second insulating layer, disposed on the first insulating layer, and disposed on the gate driver, wherein the single contiguous material layer at least partially covers the gate driver in the peripheral area and comprises the grid structure of intersecting rows and columns of partition walls that partition the pixels and contain the fluid portions within the respective individual pixels, the pixels containing respective portions of the electrically conductive and polarizable fluid.

20. The display device of claim 19, wherein the single contiguous material layer disposed among the rows and columns of pixels has a first height with respect to the substrate and the single contiguous material disposed in the peripheral area has a second height with respect to the substrate, and wherein the first height is different from the second height.

21. The display device of claim 19, wherein the substrate is a first substrate, and wherein the peripheral area includes:
the first substrate;
a second substrate facing the first substrate, wherein the electrically conductive and polarizable fluid is disposed between the first substrate and the second substrate.

* * * * *